United States Patent
Tu et al.

(10) Patent No.: US 8,922,238 B2
(45) Date of Patent: Dec. 30, 2014

(54) TEST CIRCUIT FOR BIPOLAR JUNCTION TRANSISTOR

(75) Inventors: Yi-Xin Tu, Shenzhen (CN); Hai-Qing Zhou, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 485 days.

(21) Appl. No.: 13/217,257

(22) Filed: Aug. 25, 2011

(65) Prior Publication Data

US 2012/0319720 A1 Dec. 20, 2012

(30) Foreign Application Priority Data

Jun. 16, 2011 (CN) .......................... 2011 1 0162369

(51) Int. Cl.
*G01R 31/26* (2014.01)

(52) U.S. Cl.
CPC ................................. *G01R 31/2614* (2013.01)
USPC .................................................. 324/762.08

(58) Field of Classification Search
CPC .................................................. G01R 31/2614
See application file for complete search history.

(56) References Cited

U.S. PATENT DOCUMENTS

| 2,894,206 | A | * | 7/1959 | Montgomery | 324/762.08 |
| 3,227,953 | A | * | 1/1966 | Cerveny | 324/762.08 |
| 3,660,758 | A | * | 5/1972 | Means | 324/762.08 |
| 3,816,809 | A | * | 6/1974 | Kuster | 363/21.15 |
| 4,112,346 | A | * | 9/1978 | Tokunaga et al. | 323/312 |
| 4,924,177 | A | * | 5/1990 | Mulz | 324/133 |

FOREIGN PATENT DOCUMENTS

DE 2040488 A1 * 2/1972

OTHER PUBLICATIONS

Electronicsteacher.com, Microcontroller Beginner Kit—Learning to use LEDs and transistors, Back Ohm's Law, http://www.electronicsteacher.com/tutorial/learning-to-use-leds-and-transistors.php.*

* cited by examiner

*Primary Examiner* — Melissa Koval
*Assistant Examiner* — Courtney McDonnough
(74) *Attorney, Agent, or Firm* — Novak Druce Connolly Bove + Quigg LLP

(57) ABSTRACT

A test circuit includes a first test circuit. The first test circuit includes a first light-emitting diode (LED) and a first resistor. An anode of the first LED is connected to a power supply. A cathode of the first LED is connected to a collector of a bipolar junction transistor (BJT) through the first resistor. An emitter of the BJT is grounded. A base of the BJT is connected to the power supply. A type of the BJT can be determined according to status of the first LED.

16 Claims, 2 Drawing Sheets

TEST CIRCUIT FOR BIPOLAR JUNCTION TRANSISTOR

BACKGROUND

1. Technical Field

The disclosure generally relates to test circuits, particular to a test circuit for a bipolar junction transistor (BJT).

2. Description of Related Art

Parameters of a BJT can be measured using an ohmmeter. In particular, a measuring method for the BJT is to respectively connect two pins of the BJT to a red probe and a back probe of the ohmmeter in turn to obtain impedances in each of two pins. In this way, a type of the BJT can be determined according to a relationship among the impedances. However, a plurality of tests may be time consuming and inefficient.

Therefore, there is room for improvement within the art.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment.

DETAILED DESCRIPTION

Figure 1:
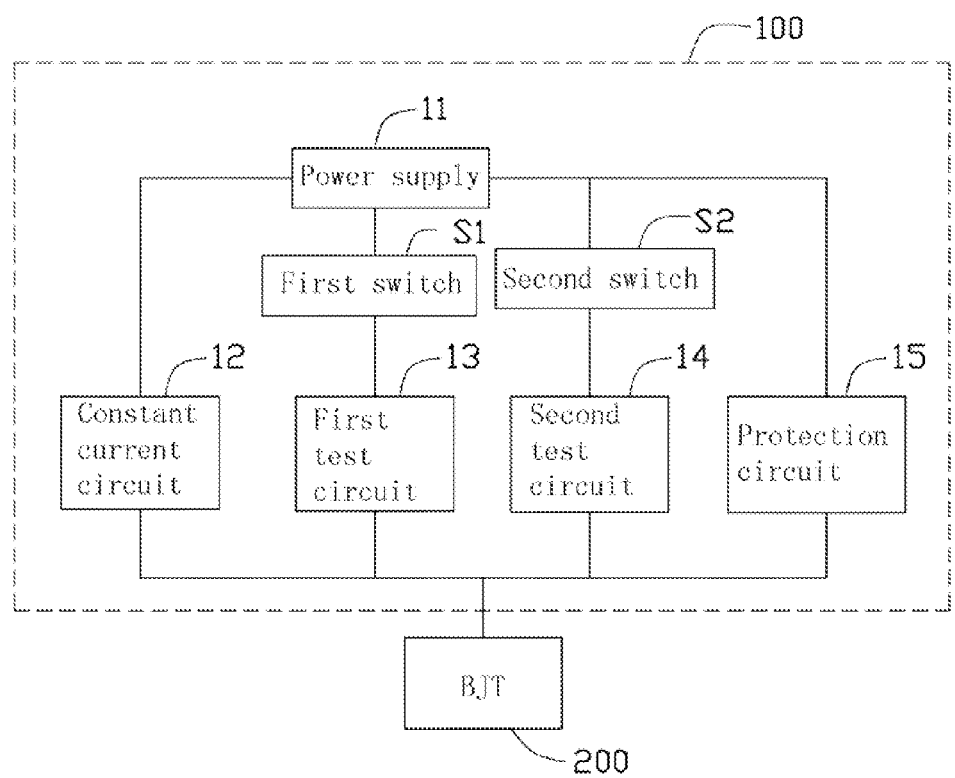
FIG. 1 is a block diagram of a test circuit, according to an exemplary embodiment.

FIG. 1 shows a test circuit 100, according to an exemplary embodiment.

The test circuit 100 can measure a type and a common emitter current gain β of a bipolar junction transistor (BJT) 200. The common emitter current gain β is a ratio of a collector current of the BJT 200 to a base current of the BJT 200. The test circuit 100 includes a power supply 11, a constant current circuit 12, a first test circuit 13, and a second test circuit 14.

Figure 2:
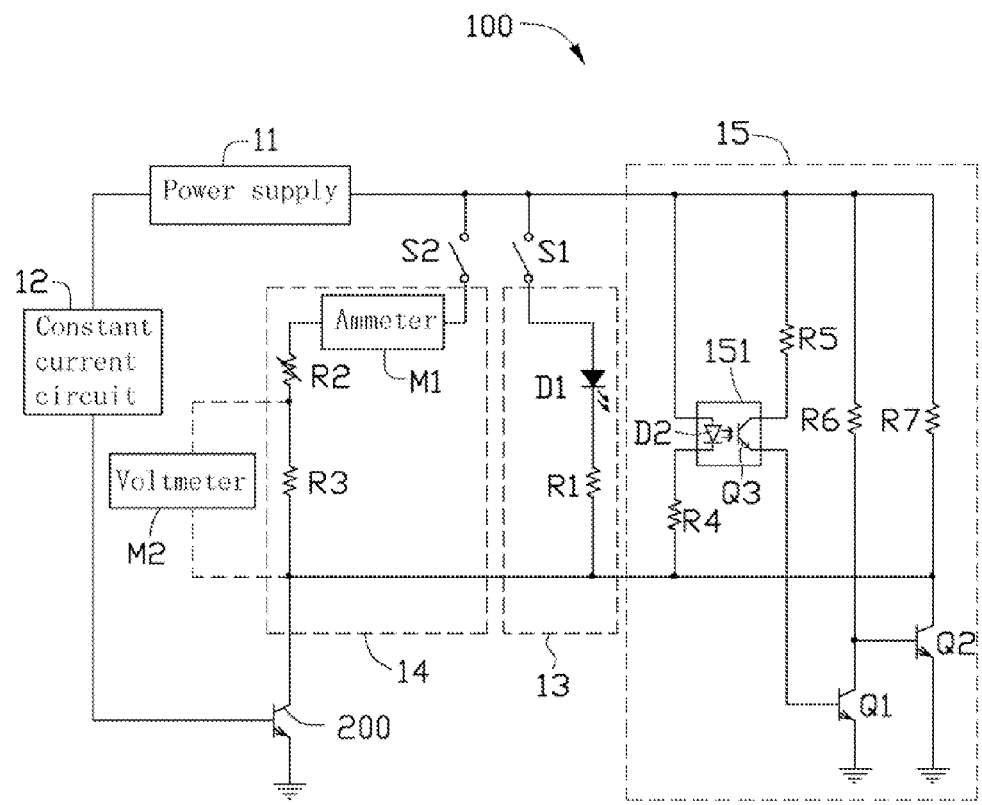
FIG. 2 is a circuit diagram of one embodiment of the test circuit shown in FIG. 1.

Referring to FIG. 2, the power supply 11 may be a battery, for example. The constant current circuit 12 may be a current source, for example. The constant current circuit 12 is connected between the power supply 11 and the base of the BJT 200, and outputs a steady base current Ib to the BJT 200. An emitter of the BJT 200 is grounded. The collector of the BJT 200 is connected to the first test circuit 13 and the second test circuit 14.

The first test circuit 13 includes a first light-emitting diode (LED) D1 and a first resistor R1. An anode of the first LED D1 is connected to the power supply 11. A cathode of the first LED D1 is connected to the collector of the BJT 200 through the first resistor R1.

The second test circuit 14 includes a second resistor R2, a third resistor R3, and an ammeter M1. One end of the second resistor R2 is connected to the power supply 11 via the ammeter M1. The other end of the second resistor R2 is connected to the collector of the testing BJT 200 via the third resistor R3.

In use of the test circuit 100, the first test circuit 13 measures the type of the BJT 200, and the second test circuit 14 measures the common emitter current gain β of the BJT 200. In particular, if the BJT 200 is a npn BJT, the BJT 200 is turned on. In this way, the cathode of the first LED D1 is connected to ground through the collector and the emitter of the BJT 200 (i.e., substantially grounded), and the anode of the first LED D1 is connected to the power supply 11. Thus, a potential difference between the anode and the cathode of the first LED D1 becomes large enough to drive the first LED D1 to emit light, thereby reminding users that the type of the BJT 200 is a predetermined type, npn, for example. Reversely, if the BJT 200 is a pnp BJT, the BJT 200 is turned off. In this way, the first diode D1 is turned off and does not emit light.

When testing the common emitter current gain β of the BJT 200, a value Ic of a collector current of the BJT 200 is detected via the ammeter M1. Since the constant current circuit 12 outputs a steady current Ib to the base of the BJT 200, a value β of the common emitter current gain of the BJT 200 can be calculated according to a formula:

$$\beta = Ic/Ib.$$

In the present embodiment, the test circuit 100 further includes a protection circuit 15. The protection circuit 15 is connected between the power supply 11 and the BJT 200. In particular, the protection circuit 15 includes an optical coupler (OC) 151, a first transistor Q1, a second transistor Q2, a fourth resistor R4, a fifth resistor R5, a sixth resistor R6, and a seventh resistor R7. In the present embodiment, both the first transistor Q1 and the second transistor Q2 are npn transistors. The OC 151 includes a second LED D2, and a phototransistor Q3. An anode of the second LED D2 is connected to the power supply 11. A cathode of the second LED D2 is connected to the collector of the BJT 200 via the fourth resistor R4. A collector of the phototransistor Q3 is connected to the power supply 11 by the fifth resistor R5. An emitter of the phototransistor Q3 is connected to a base of the first transistor Q1. An emitter of the first transistor Q1 is grounded. A collector of the first transistor Q1 is connected between an end of the sixth resistor R6 and a base of the second transistor Q2. The other end of the sixth resistor R6 is connected to the power supply 11. An emitter of the second transistor Q2 is grounded. A collector of the second transistor Q2 is connected to the power supply 11 through the seventh resistor R7.

In use of the protection circuit 15, if the type of the BJT 200 meets a predetermined type (e.g., npn), the BJT 200 is turned on and an original voltage of the power supply 11 inputs to ground via the second LED D2 and the BJT 200. In addition, current is generated through the second LED D2, the collector, and the emitter of the BJT 200. When the current passes through the second LED D2, the second LED D2 emits light accordingly. The phototransistor Q3 sensors the light emitted by the second LED D2, and accordingly outputs a current to the base of the first transistor Q1. Upon receiving the current from the phototransistor Q3, the first transistor Q1 is turned on and the second transistor Q2 is turned off. In this way, the collector of the first transistor Q1 is connected to the power supply 11 by the seventh resistor R7, and generates a predetermined logic 1 (electric levels higher than a rated value).

Alternatively, if the BJT 200 is a pnp BJT, the BJT 200 is turned off, and the second LED D2, the phototransistor Q3 are both turned off accordingly. Since the base of the first transistor Q1 is connected to the power supply 11 by the OC 151, the first transistor Q1 is turned off and the second transistor Q2 is turned on. In this way, the collector of the BJT 200 is connected to ground via the collector and the emitter of the second transistor Q2, and generates a predetermined logic 0 (e.g., electric levels lower than a rated voltage). Thus, the BJT 200 is protected from being further damaged due to an overvoltage generated by the collector of the BJT 200.

In the present embodiment, the test circuit 100 further includes a first switch S1, and a second switch S2. The first switch S1 is connected between the power supply 11 and the first test circuit 13. The second switch S2 is connected between the power supply 11 and the second test circuit 14. In this embodiment, fixed contacts of the first switch S1 and the second switch S2 are both connected to the power supply 11. Movable contacts of the first switch S1 and the second switch S2 are respectively connected to the first test circuit 13 and the second test circuit 14. The type of the BJT 200 or the common emitter current gain β of the BJT 200 can be measured by operating the first switch S1 or the second switch S2. For example, when the first switch S1 is turned on and the second switch S2 is turned off, the type of the BJT 200 is measured. When the first switch S1 is turned off and the second switch S2 is turned on, the β of the BJT 200 is measured.

In other embodiments, the ammeter M1 can be replaced by a voltmeter M2. The voltmeter M2 is connected in parallel to the second resistor R2 or the third resistor R3. The collector current Ic of the BJT 200 is obtained according to a formula: Ic=Vc/R (Vc represents a voltage of the second resistor R2 or the third resistor R3, the R represents an impedance of the second resistor R2 or the third resistor R3).

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A test circuit for testing a bipolar junction transistor (BJT), the test circuit comprising:
   a first test circuit comprising a first light-emitting diode (LED) and a first resistor, wherein an anode of the first LED is connected to a power supply, a cathode of the first LED is connected to a collector of the BJT through the first resistor, an emitter of the BJT is grounded; a base of the BJT is connected to the power supply; and the first LED is turned on or off to indicate a type of the BJT; and
   a protection circuit used to protect the BJT from being damaged due to an over-voltage, wherein the protection circuit comprises an optical coupler (OC), a first transistor, and a second transistor, the OC comprises a second LED, and a phototransistor, an anode of the second LED is connected to the power supply, a cathode of the second LED is connected to the collector of the BJT via a fourth resistor, a collector of the phototransistor is connected to the power supply by a fifth resistor, an emitter of the phototransistor is connected to a base of the first transistor, an emitter of the first transistor is grounded, a collector of the first transistor is connected between an end of a sixth resistor and a base of the second transistor, the other end of the sixth resistor is connected to the power supply, an emitter of the second transistor is grounded, a collector of the second transistor is connected to the power supply through a seventh resistor.

2. The test circuit as claimed in claim 1, further comprising a second test circuit, wherein the second test circuit is connected between the power supply and the collector of the BJT, and is used to measure a common emitter current gain (β) of the BJT.

3. The test circuit as claimed in claim 2, wherein the second test circuit includes a second resistor and a third resistor, an end of the second resistor is connected to the power supply, the other end of the second resistor is connected to the collector of the BJT through the third resistor.

4. The test circuit as claimed in claim 3, further comprising a constant current circuit connected between the power supply and the base of the BJT, wherein the constant current circuit provides a steady base current Ib to the base of the BJT.

5. The test circuit as claimed in claim 4, wherein the second test circuit calculates the β according to a formula: β=Ic/Ib, the Ic is a collector current of the BJT measured by an ammeter connected in series to the second resistor and the third resistor.

6. The test circuit as claimed in claim 4, wherein the second test circuit calculates the β according to a formula: β=Ic/Ib, the Ic is a collector current of the BJT measured by a voltmeter connected in parallel to the second resistor or the third resistor.

7. The test circuit as claimed in claim 2, further including a first switch and a second switch, wherein the first switch is connected between the power supply and the first test circuit, the second switch is connected between the power supply and the second test circuit, the type and the β of the BJT can be respectively measured via operating the first switch or the second switch.

8. The test circuit as claimed in claim 7, wherein fixed contacts of the first switch and the second switch are both connected to the power supply, movable contacts of the first switch and the second switch are respectively connected to the first test circuit and the second test circuit.

9. A test circuit for testing a bipolar junction transistor (BJT), the test circuit comprising:
   a first test circuit comprising a first light-emitting diode (LED) and a first resistor, wherein an anode of the first LED is connected to a power supply, a cathode of the first LED is connected to a collector of the BJT through the first resistor, an emitter of the BJT is grounded; a base of the BJT is connected to the power supply; and
   a protection circuit used to protect the BJT from being damaged due to an over-voltage; wherein the protection circuit comprises an optical coupler (OC), a first transistor, and a second transistor, the OC comprises a second LED and a phototransistor, an anode of the second LED is connected to the power supply, a cathode of the second LED is connected to the collector of the BJT via a fourth resistor, a collector of the phototransistor is connected to the power supply by a fifth resistor, an emitter of the phototransistor is connected to a base of the first transistor, an emitter of the first transistor is grounded, a collector of the first transistor is connected between an end of a sixth resistor and a base of the second transistor, the other end of the sixth resistor is connected to the power supply, an emitter of the second transistor is grounded, a collector of the second transistor is connected to the power supply through a seventh resistor.

10. The test circuit as claimed in claim 9, further comprising a second test circuit, wherein the second test circuit is connected between the power supply and the collector of the BJT, and is used to measure a common emitter current gain (β) of the BJT.

11. The test circuit as claimed in claim 10, wherein the second test circuit comprises a second resistor and a third resistor, an end of the second resistor is connected to the power supply, the other end of the second resistor is connected to the collector of the BJT through the third resistor.

12. The test circuit as claimed in claim 11, further comprising a constant current circuit connected between the power supply and the base of the BJT, wherein the constant current circuit provides a steady base current Ib to the base of the BJT.

13. The test circuit as claimed in claim 12, wherein the second test circuit calculates the β according to a formula:

$\beta=Ic/Ib$, the Ic is a collector current of the BJT measured by an ammeter connected in series to the second resistor and the third resistor.

14. The test circuit as claimed in claim 12, wherein the second test circuit calculates the $\beta$ according to a formula: $\beta=Ic/Ib$, the Ic is a collector current of the BJT measured by a voltmeter connected in parallel to the second resistor or the third resistor.

15. The test circuit as claimed in claim 10, further including a first switch and a second switch, wherein the first switch is connected between the power supply and the first test circuit, the second switch is connected between the power supply and the second test circuit, the type and the $\beta$ of the BJT can be respectively measured via operating the first switch or the second switch.

16. The test circuit as claimed in claim 15, wherein fixed contacts of the first switch and the second switch are both connected to the power supply, movable contacts of the first switch and the second switch are respectively connected to the first test circuit and the second test circuit.

* * * * *